US008780581B2

(12) United States Patent
Merz et al.

(10) Patent No.: US 8,780,581 B2
(45) Date of Patent: Jul. 15, 2014

(54) STRUCTURES FOR FORMING CONDUCTIVE PATHS IN ANTENNAS DEVICE AND OTHER ELECTRONIC DEVICE STRUCTURES

(75) Inventors: Nicholas G. L. Merz, San Francisco, CA (US); Daniel W. Jarvis, Sunnyvale, CA (US); Sawyer I. Cohen, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 280 days.

(21) Appl. No.: 13/024,300

(22) Filed: Feb. 9, 2011

(65) Prior Publication Data

US 2012/0176279 A1 Jul. 12, 2012

Related U.S. Application Data

(60) Provisional application No. 61/431,520, filed on Jan. 11, 2011.

(51) Int. Cl.
*H05K 7/14* (2006.01)
*H05K 7/18* (2006.01)

(52) U.S. Cl.
USPC .......................................... 361/799; 361/818

(58) Field of Classification Search
USPC .......................................... 361/799, 816, 818
See application file for complete search history.

(56) References Cited

U.S. PATENT DOCUMENTS

| | | | | |
|---|---|---|---|---|
| 5,173,055 | A * | 12/1992 | Grabbe | 439/66 |
| 7,168,959 | B2 * | 1/2007 | Kuo et al. | 439/67 |
| 7,179,126 | B2 * | 2/2007 | Chen | 439/607.35 |
| 7,321,335 | B2 | 1/2008 | Egorov | |
| 7,339,533 | B2 | 3/2008 | Kurashima et al. | |
| 7,672,142 | B2 | 3/2010 | Wang et al. | |
| 7,688,267 | B2 | 3/2010 | Hill | |
| 7,705,795 | B2 | 4/2010 | Chiang et al. | |
| 7,722,398 | B2 * | 5/2010 | Ma | 439/607.04 |
| 7,724,530 | B2 | 5/2010 | Clayton et al. | |
| 7,750,857 | B2 | 7/2010 | Kim | |

(Continued)

FOREIGN PATENT DOCUMENTS

| | | |
|---|---|---|
| CN | 101682119 | 3/2010 |
| CN | 201533015 | 7/2010 |
| EP | 2109185 | 10/2009 |

OTHER PUBLICATIONS

Merz et al., U.S. Appl. No. 13/024,303, filed Feb. 10, 2011.

(Continued)

*Primary Examiner* — Hung S Bui
(74) *Attorney, Agent, or Firm* — Treyz Law Group; G. Victor Treyz; Michael H. Lyons

(57) ABSTRACT

Electronic devices may be provided that contain conductive paths. A conductive path may be formed from an elongated metal member that extends across a dielectric gap in an antenna. The antenna may be formed from conductive structures that form an antenna ground and conductive structures that are part of a peripheral conductive housing member in the electronic device. The gap may separate the peripheral conductive housing member from the conductive structures. A conductive path may also be formed using one or more springs. A spring may be welded to a conductive member and may have prongs that press against an additional conductive member when the spring is compressed. The prongs may have narrowed tips, curved shapes, and burrs that help form a satisfactory electrical contact between the spring prongs and the additional conductive member.

14 Claims, 9 Drawing Sheets

(56) References Cited

U.S. PATENT DOCUMENTS

| | | | | |
|---|---|---|---|---|
| 7,808,434 | B2 | 10/2010 | White et al. | |
| 7,876,274 | B2 | 1/2011 | Hobson et al. | |
| 7,889,139 | B2 | 2/2011 | Hobson et al. | |
| 2004/0257283 | A1 | 12/2004 | Asano et al. | |
| 2008/0074329 | A1 | 3/2008 | Caballero et al. | |
| 2008/0316115 | A1 | 12/2008 | Hill et al. | |
| 2008/0316117 | A1 | 12/2008 | Hill et al. | |
| 2009/0065933 | A1 | 3/2009 | Takehara et al. | |
| 2009/0153410 | A1 | 6/2009 | Chiang et al. | |
| 2009/0174612 | A1 | 7/2009 | Ayala et al. | |
| 2009/0256759 | A1 | 10/2009 | Hill et al. | |
| 2009/0273523 | A1 | 11/2009 | Sakuma | |
| 2010/0123632 | A1 | 5/2010 | Hill et al. | |
| 2010/0321255 | A1 | 12/2010 | Kough et al. | |
| 2011/0316751 | A1 | 12/2011 | Jarvis et al. | |
| 2012/0176754 | A1 * | 7/2012 | Merz et al. | 361/751 |

OTHER PUBLICATIONS

Merz et al., U.S. Appl. No. 13/018,142, filed Jan. 31, 2011.

Hobson et al., U.S. Appl. No. 13/008,586, filed Jan. 18, 2011.

* cited by examiner

STRUCTURES FOR FORMING CONDUCTIVE PATHS IN ANTENNAS DEVICE AND OTHER ELECTRONIC DEVICE STRUCTURES

This application claims the benefit of provisional patent application No. 61/431,520, filed Jan. 11, 2011, which is hereby incorporated by reference herein in its entirety.

BACKGROUND

This relates generally to electronic devices, and, more particularly, to conductive electronic device structures such as structures that form conductive paths for antennas and other electronic device structures.

Electronic devices such as cellular telephones and other devices often contain wireless communications circuitry. The wireless communications circuitry may include, for example, cellular telephone transceiver circuits for communicating with cellular telephone networks. Wireless communications circuitry in an electronic device may also include wireless local area network circuits and other wireless circuits. Antenna structures are used in transmitting and receiving wireless signals.

To satisfy consumer demand for small form factor wireless devices, manufacturers are continually striving to implement wireless communications circuitry such as antennas using compact arrangements. At the same time, it may be desirable to include conductive structures such as metal device housing components in an electronic device. Because conductive components can affect radio-frequency performance, care must be taken when incorporating antennas into an electronic device that includes conductive structures. In some arrangements, it may be desirable to use conductive housing structures in forming antenna structures for a device. Doing so may entail formation of electrical connections between different portions of the device. For example, it may be desirable to form an electrical connection between internal device components and a conductive peripheral housing member.

The presence of wireless communications circuitry in environments that contain cameras and other electrical components that can generate interference also poses challenges. If care is not taken, signals from an electronic component source can disrupt the operation of the wireless circuitry.

In view of these challenges, it may be desirable to be able to form electrical connections between different portions of an electronic device. It may, for example, be desirable to bridge a gap in an antenna or to form ground paths that help ground conductive portions of a device and thereby suppress interference.

SUMMARY

Electronic devices may be provided that contain conductive paths. A conductive path may be formed from an elongated metal member that extends across a dielectric gap in an antenna. The elongated metal member may be a strip of stainless steel that is welded to conductive structures at either end using a laser welding process that is suitable for volume manufacturing.

The antenna may be formed from conductive structures that form an antenna ground and conductive structures that are part of a peripheral conductive housing member in the electronic device. The conductive structures that form the antenna ground may include planar metal housing structures. The gap may separate the peripheral conductive housing member from the planar metal housing structures.

A conductive path may also be formed using one or more springs. A spring may be welded to a conductive member and may have prongs that press against an additional conductive member when the spring is compressed. The prongs may have narrowed tips to accentuate the force produced by the tips on opposing metal surfaces, thereby ensuring satisfactory electrical contact. Curved prong shapes and burrs on the spring prongs may also help form a satisfactory electrical contact between the spring prongs and opposing metal surfaces.

Further features of the invention, its nature and various advantages will be more apparent from the accompanying drawings and the following detailed description of the preferred embodiments.

DETAILED DESCRIPTION

Electronic devices may be provided with conductive structures. For example, electronic devices may be provided with conductive structures that form antennas, electromagnetic shields, and other components. Conductive paths may be formed between the conductive structures. For example, a conductive member may be used to bridge a dielectric gap in an antenna and conductive spring structures may be provided that help form electrical connections between conductive parts of an electronic device such as grounded metal structures.

Figure 1:
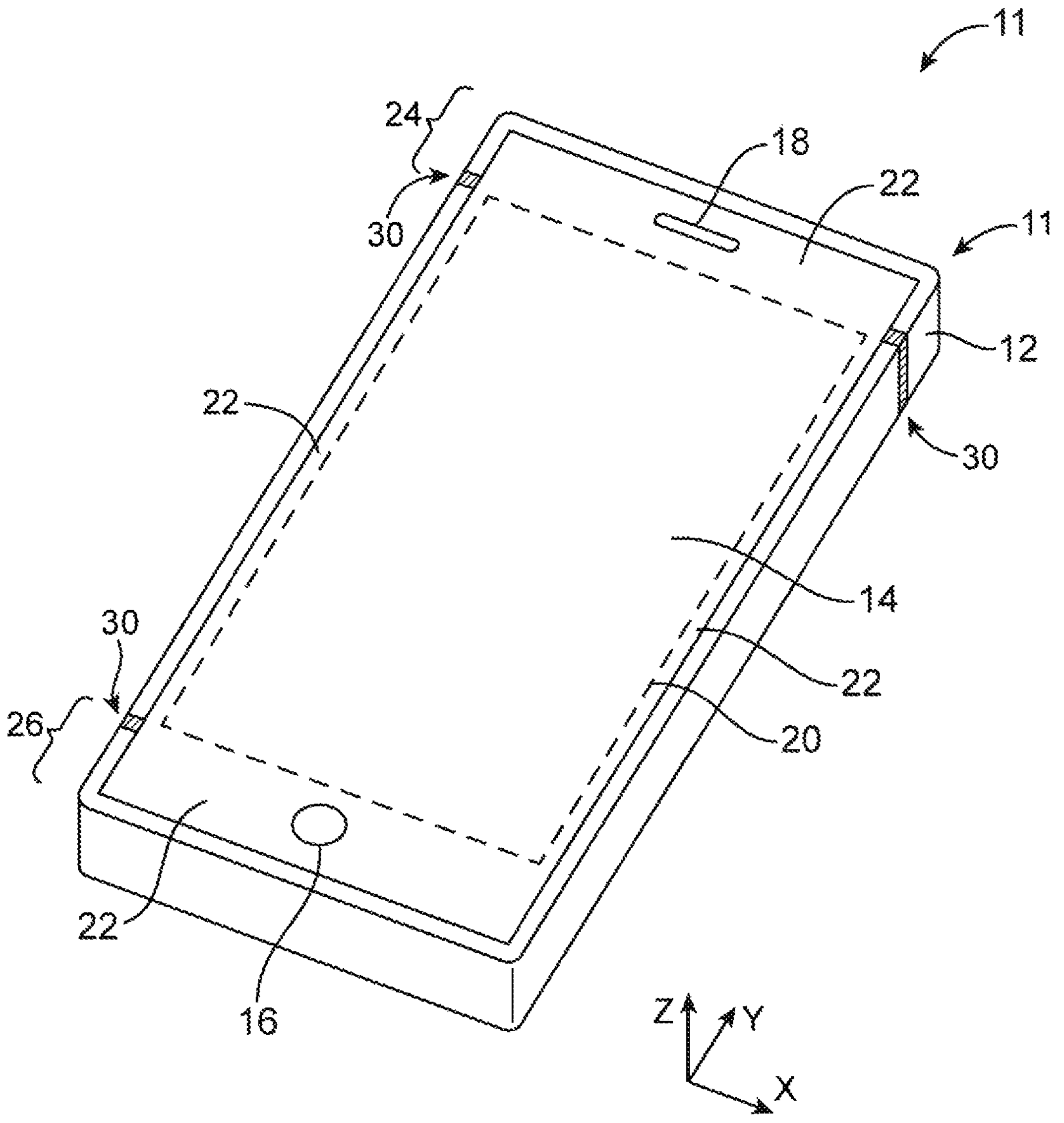
FIG. 1 is a perspective view of an illustrative electronic device of the type that may be provided with antenna structures in which an electrical connection is made to a conductive housing structure such as a conductive peripheral housing member and in which signal paths may be formed using conductive structures such as springs in accordance with an embodiment of the present invention.

An illustrative electronic device of the type that may contain conductive structures such as these is shown in FIG. 1. Device 10 of FIG. 1 may be a notebook computer, a tablet computer, a computer monitor with an integrated computer, a desktop computer, or other electronic equipment. If desired, electronic device 10 may be a portable device such as a cellular telephone, a media player, other handheld devices, a wrist-watch device, a pendant device, an earpiece device, or other compact portable device.

As shown in FIG. 1, device 10 may have a housing such as housing 11. Housing 11 may be formed from materials such as plastic, metal, carbon fiber and other fiber composites, ceramic, glass, wood, other materials, or combinations of these materials. Device 10 may be formed using a unibody construction in which some or all of housing 11 is formed from a single piece of material (e.g., a single cast or machined piece of metal, a single piece of molded plastic, etc.) or may be formed from frame structures, housing sidewall structures, and other structures that are assembled together using fasteners, adhesive, and other attachment mechanisms. In the illustrative arrangement shown in FIG. 1, housing 11 includes conductive peripheral housing member 12. Conductive peripheral housing member 12 may have a ring shape that runs around the rectangular periphery of device 10. One or more gaps such as gaps 30 may be formed in conductive peripheral housing member 12. Gaps such as gaps 30 may be filled with dielectric such as plastic and may interrupt the otherwise continuous shape of conductive peripheral housing member. Conductive peripheral housing member may have any suitable number of gaps 30 (e.g., more than one, more than two, three or more, less than three, etc.).

Conductive peripheral housing member 12 may be formed from a durable material such as metal. Stainless steel may be used for forming housing member 12 because stainless steel is aesthetically appealing, strong, and can be machined during manufacturing. Other metals may be used if desired. The rear face of housing 11 may be formed from plastic, glass, metal, ceramic composites, or other suitable materials. For example, the rear face of housing 11 may be formed form a plate of glass having regions that are backed by a layer of internal metal for added strength. Conductive peripheral housing member 12 may be relatively short in vertical dimension Z (e.g., to serve as a bezel for display 14) or may be taller (e.g., to serve as the sidewalls of housing 11 as shown in the illustrative arrangement of FIG. 1).

Device 10 may include components such as buttons, input-output port connectors, ports for removable media, sensors, microphones, speakers, status indicators, and other device components. As shown in FIG. 1, for example, device 10 may include buttons such as menu button 16. Device 10 may also include a speaker port such as speaker port 18 (e.g., to serve as an ear speaker for device 10).

Wireless communications circuitry in electronic device 10 may be used to support wireless communications in one or more wireless communications bands. Antenna structures in electronic device 10 may be used in transmitting and receiving radio-frequency signals.

One or more antennas may be formed in device 10. The antennas may, for example, be formed in locations such as locations 24 and 26 to provide separation from the conductive elements of display 14. Antennas may be formed using single band and multiband antenna structures. Examples of communications bands that may be covered by the antennas include cellular telephone bands (e.g., the bands at 700 MHz, 850 MHz, 900 MHz, 1800 MHz, 1900 MHz, and 2100 MHz), satellite navigation bands (e.g., the Global Positioning System band at 1575 MHz), wireless local area network bands such as the IEEE 802.11 (WiFi®) bands at 2.4 GHz and 5 GHz, the Bluetooth band at 2.4 GHz, etc. Examples of antenna configurations that may be used for the antennas in device 10 include monopole antennas, dipole antennas, strip antennas, patch antennas, inverted-F antennas, coil antennas, planar inverted-F antennas, open slot antennas, closed slot antennas, loop antennas, hybrid antennas that include antenna structures of multiple types, or other suitable antenna structures.

Device 10 may include one or more displays such as display 14. Display 14 may be a liquid crystal display (LCD), an organic light-emitting diode (OLED) display, a plasma display, an electronic ink display, etc. A touch sensor may be incorporated into display 14 (i.e., display 14 may be a touch screen). The touch sensor may be an acoustic touch sensor, a resistive touch sensor, a piezoelectric touch sensor, a capacitive touch sensor (e.g., a touch sensor based on an array of indium tin oxide capacitor electrodes), or a touch sensor based on other touch technologies.

Display 14 may be covered by a transparent planar conductive member such as a layer of glass or plastic. The cover layer for display 14, which is sometimes referred to as a cover glass layer or cover glass, may extend over substantially all of the front face of device 10, as shown in FIG. 1. The rectangular center portion of the cover glass (surrounded by dashed line 20 in FIG. 1) contains an array of image pixels and is sometimes referred to as the active portion of the display. The peripheral outer portion of the cover glass (i.e., rectangular peripheral ring 22 of FIG. 1) does not contain any active image pixels and is sometimes referred to as the inactive portion of display 14. A patterned opaque masking layer such as a peripheral ring of black ink may be formed under inactive portion 22 to hide interior device components from view by a user.

Figure 2:
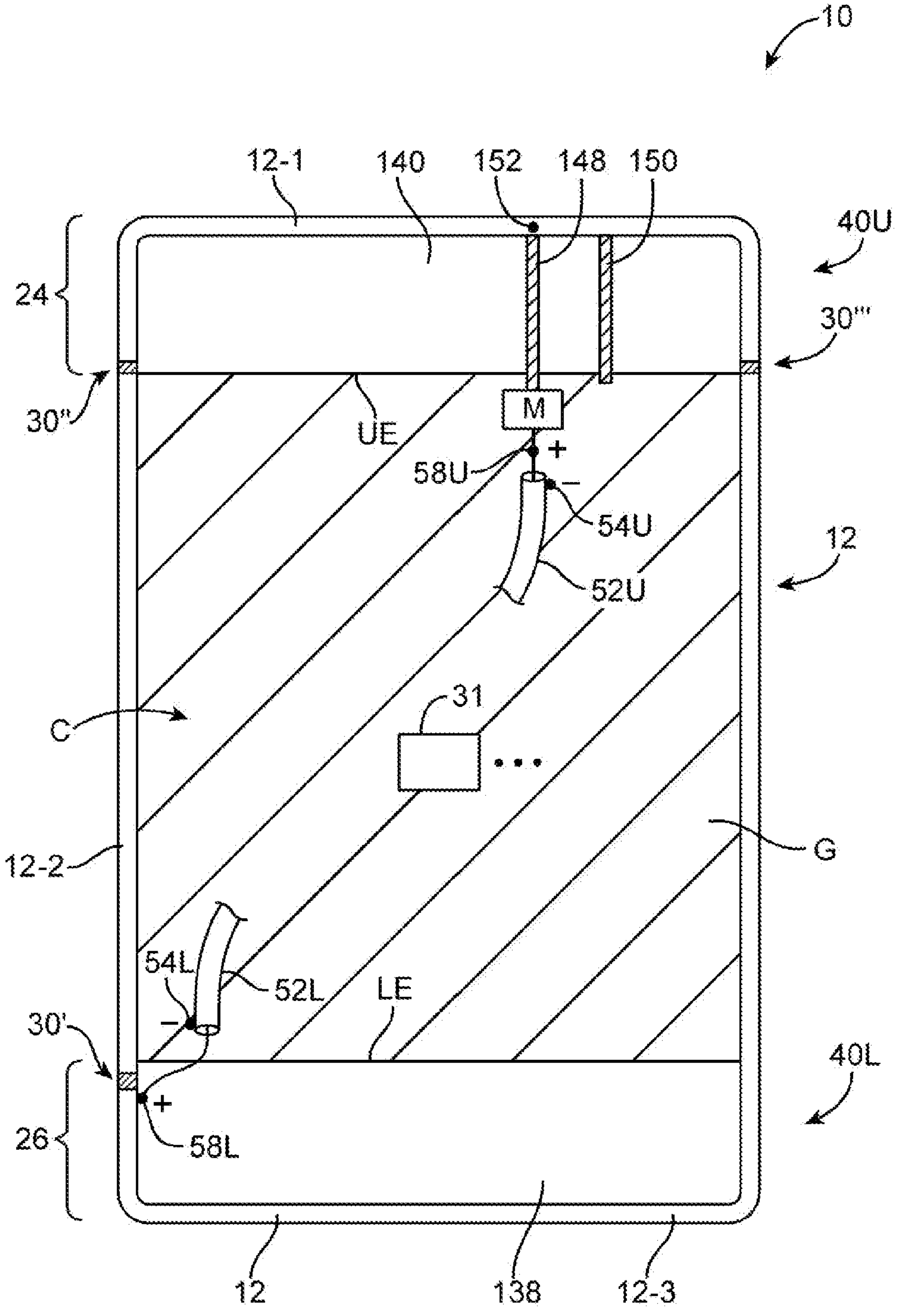
FIG. 2 is a top interior view of an electronic device of the type shown in FIG. 1 in which electrical connections are made to a conductive peripheral housing member in accordance with an embodiment of the present invention.

FIG. 2 is a top view of the interior of device 10 showing how antennas 40L and 40U may be implemented within housing 11 and housing member 12. As shown in FIG. 2, ground plane G may be formed within housing 11 and may be surrounded by peripheral conductive housing member 12. Ground plane G may form antenna ground for antennas 40L and 40U. Because ground plane G may serve as antenna ground, ground plane G may sometimes be referred to as antenna ground, ground, or a ground plane element (as examples). One or more printed circuit boards or other mounting structures may be used to mount components 31 in device 10. Components 31 may include radio-frequency transceiver circuits that are coupled to antennas 40U and 40L using transmission lines 52L and 52U, processors, application-specific integrated circuits, cameras, sensors, switches, connectors, buttons, and other electronic device components.

In central portion C of device 10, ground plane G may be formed by conductive structures such as a conductive housing midplate member (sometimes referred to as an internal housing plate or planer internal housing structures). The structures of ground plane G may be connected between the left and right edges of member 12. Printed circuit boards with conductive ground traces (e.g., one or more printed circuit boards used to mount components 31) may form part of ground plane G.

The midplate member may have one or more individual sections (e.g., patterned sheet metal sections) that are welded together. Portions of the midplate structures may be covered with insert-molded plastic (e.g., to provide structural support in portions of the interior of device where no conductive ground is desired, such dielectric-filled portions of antennas 40U and 40L in regions 24 and 26).

At ends 24 and 26 of device 10, the shape of ground plane G may be determined by the shapes and locations of conductive structures that are tied to ground. Ground plane G in the simplified layout of FIG. 2 has a straight upper edge UE and a straight lower edge LE. In actual devices, the upper and lower edges of ground plane G and the interior surface of peripheral conductive housing member 12 generally have more complex shapes determined by the shapes of individual conductive structures that are present in device 10. Examples of conductive structures that may overlap to form ground plane G and that may influence the shape of the inner surface of member 12 include housing structures (e.g., a conductive housing midplate structure, which may have protruding portions), conductive components (e.g., switches, cameras, data connectors, printed circuits such as flex circuits and rigid printed circuit boards, radio-frequency shielding cans, buttons and conductive button mounting structures), and other conductive structures in device 10. In the illustrative layout of FIG. 2, the portions of device 10 that are conductive and tied to ground to form part of ground plane G are shaded and are contiguous with central portion C.

Openings such as openings 138 and 140 (sometimes referred to as gaps) may be formed between ground plane G and respective portions of peripheral conductive housing member 12. Openings 138 and 140 may be filled with air, plastic, and other dielectrics and are therefore sometimes referred to as dielectric-filled gaps or openings. Openings 138 and 140 may be associated with antenna structures 40U and 40L.

Lower antenna 40L may be formed by a loop antenna structure having a shape that is determined at least partly by the shape of the lower portions of ground plane G and conductive housing member 12. In the example of FIG. 2, opening 138 is depicted as being rectangular, but this is merely illustrative. In practice, the shape of opening 138 may be dictated by the placement of conductive structures in region 26 such as a microphone, flex circuit traces, a data port connector, buttons, a speaker, etc.

Lower antenna 40L may be fed using an antenna feed made up of positive antenna feed terminal 58L and ground antenna feed terminal 54L. Transmission line 52L may be coupled to the antenna feed for lower antenna 40L. Gap 30' may form a capacitance that helps configure the frequency response of antenna 40L. If desired, device 10 may have conductive housing portions, matching circuit elements, and other structures and components that help match the impedance of transmission line 52L to antenna 40L.

Antenna 40U may be a two-branch inverted-F antenna. Transmission line 52U may be used to feed antenna 40U at antenna feed terminals 58U and 54U. Conductive structures 150 may form a shorting path that bridges dielectric opening 140 and electrically shorts ground plane G to peripheral housing member 12. Conductive structure 148 (which may be formed using structures of the type used in forming structures 150 or other suitable structures) and matching circuit M may be used to connect antenna feed terminal 58U to peripheral conductive member 12 at point 152. Conductive structures such as structures 148 and 150 (which are sometimes referred to as conductive paths) may be formed by flex circuit traces, conductive housing structures, springs, screws, welded connections, solder joints, brackets, metal plates, or other conductive structures.

Gaps such as gaps 30', 30", and 30'" (e.g., gaps 30 of FIG. 1) may be present in peripheral conductive member 12. A phantom gap may be provided in the lower right-hand portion of device 10 for aesthetic symmetry if desired. The presence of gaps 30', 30", and 30'" may divide peripheral conductive housing member 12 into segments. As shown in FIG. 2, peripheral conductive member 12 may include first segment 12-1, second segment 12-2, and third segment 12-3.

Segment 12-1 may form antenna resonating element arms for antenna 40U. In particular, a first portion (segment) of segment 12-1 may extend from point 152 (where segment 12-1 is fed) to the end of segment 12-1 that is defined by gap 30" and a second portion (segment) of segment 12-1 may extend from point 152 to the opposing end of segment 12-1 that is defined by gap 30'". The first and second portions of segment 12-1 may form respective branches of an inverted F antenna and may be associated with respective low band (LB) and high band (HB) antenna resonances for antenna 40U. The relative positions of structures 148 and 150 along the length of member 12-1 may affect the response of antenna 40U and may be selected to tune antenna 40U. Antenna tuning adjustments may also be made by adjusting matching circuit M, by adjusting the configuration of components used in forming paths 148 and 150, by adjusting the shapes of opening 140, etc. Antenna 40L may likewise be adjusted.

With one illustrative arrangement, antenna 40L may cover the transmit and receive sub-bands in five communications bands (e.g., 850 MHz, 900 MHz, 1800 MHz, 1900 MHz, and 2100 MHz). Antenna 40U may, as an example, be configured to cover a subset of these five illustrative communications bands. For example, antenna 40U may be configured to cover a two receive bands of interest and, with tuning, four receive bands of interest.

Figure 3:
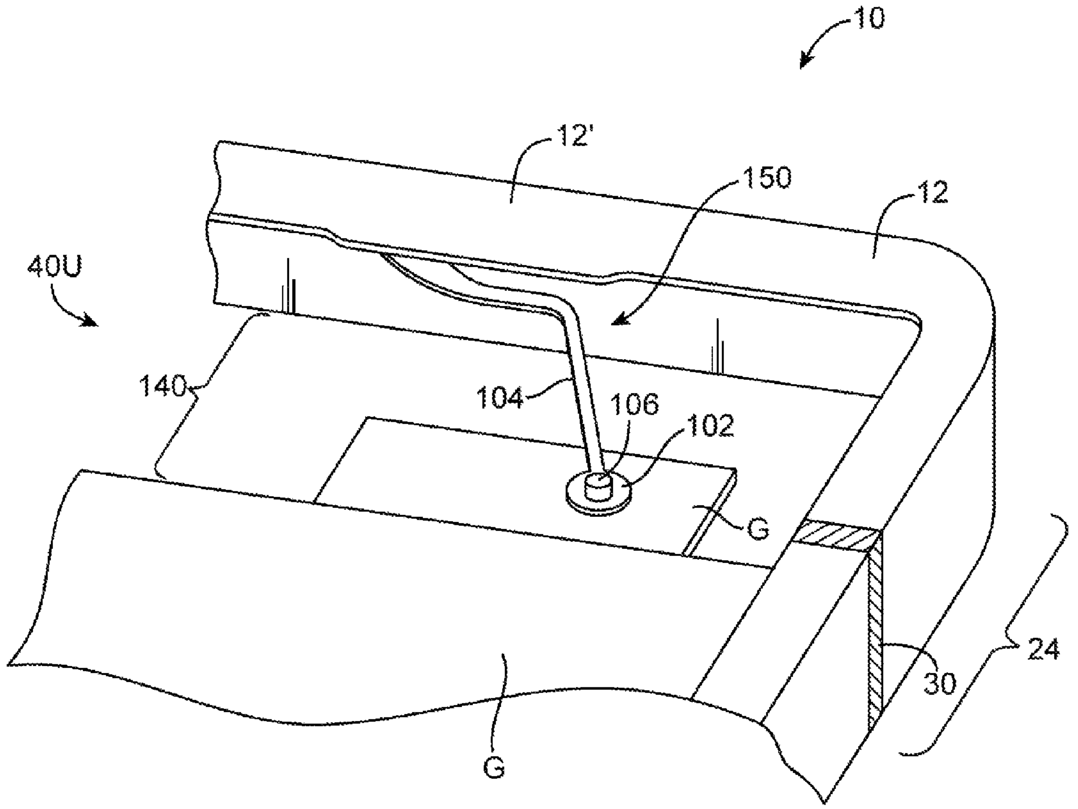
FIG. 3 is a diagram showing illustrative structures that may be used in forming an electrical connection between an internal housing structure such as a ground plate member and a conductive peripheral housing member in accordance with an embodiment of the present invention.

Illustrative structures that may be used to form shorting path 150 of FIG. 2 (e.g., the electrical path in antenna 40U that spans peripherally enclosed dielectric opening 140 and to short conductive peripheral housing member 12 to ground plane G) are shown schematically in FIG. 3. As shown in FIG. 3, path 150 may include one or more components such as conductive member 104 that bridge dielectric gap 140. One end of conductive member 104 may be connected to the underside of lip portion 12' of peripheral conductive housing member 12. The other end of conductive member 104 may have a portion such as portion 102 that is connected to ground structures G (e.g., a conductive metal housing midplate member or other conductive housing structures). Portion 102 of member 104 may have an opening such as a circular hole or other engagement feature that engages with a mating engagement feature associated with ground plane structures G. For example, a nut, post, or other part (shown as engagement member 106 in the FIG. 3 example) may form a protruding structure that is configured to pass through a circular opening in portion 102 of member 104. Member 106 may be formed from a material such as metal (as an example). This type of engagement feature arrangement may facilitate device assembly.

Conductive member 104 and engagement feature 106 may be formed from a metal such as stainless steel. Welds, conductive adhesive, solder, or other attachment mechanisms may be used in connecting engagement feature 106 to ground structures G and may be used in connecting the ends of conductive member 104 to device 10. For example, welds may be used to weld conductive member 104 to lip 12' in peripheral conductive housing member 12 and welds may be used to weld portion 102 of conductive member 104 to ground structures G and/or engagement feature 106.

Figure 4:
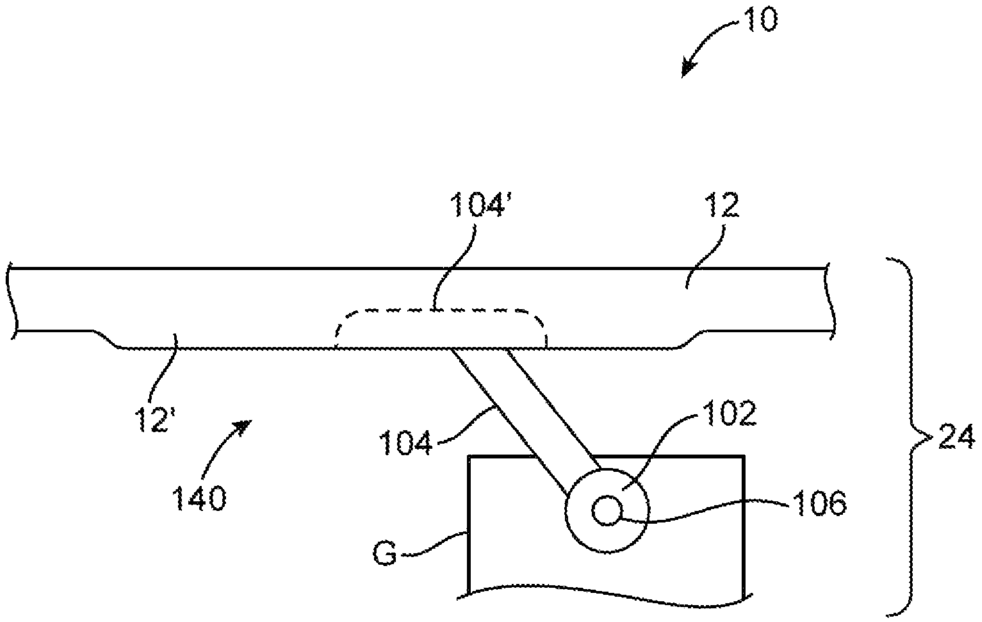
FIG. 4 is a top view of the illustrative structures of FIG. 3 in accordance with an embodiment of the present invention.

FIG. 4 is a top view of the components of FIG. 3 showing how a portion of conductive member 104 such as portion 104' (shown in dashed lines) may be enlarged to ensure that there is adequate surface area at the attachment point between conductive member 104 and peripheral conductive housing member 12. The main elongated body portion of conductive member 104 may be formed from a strip of stainless steel or other metal. Conductive member 104 may, for example, have an elongated body portion with a thickness of about 0.03 to 0.8 mm and a width of about 0.05 to 2 mm (as examples).

Figure 5:
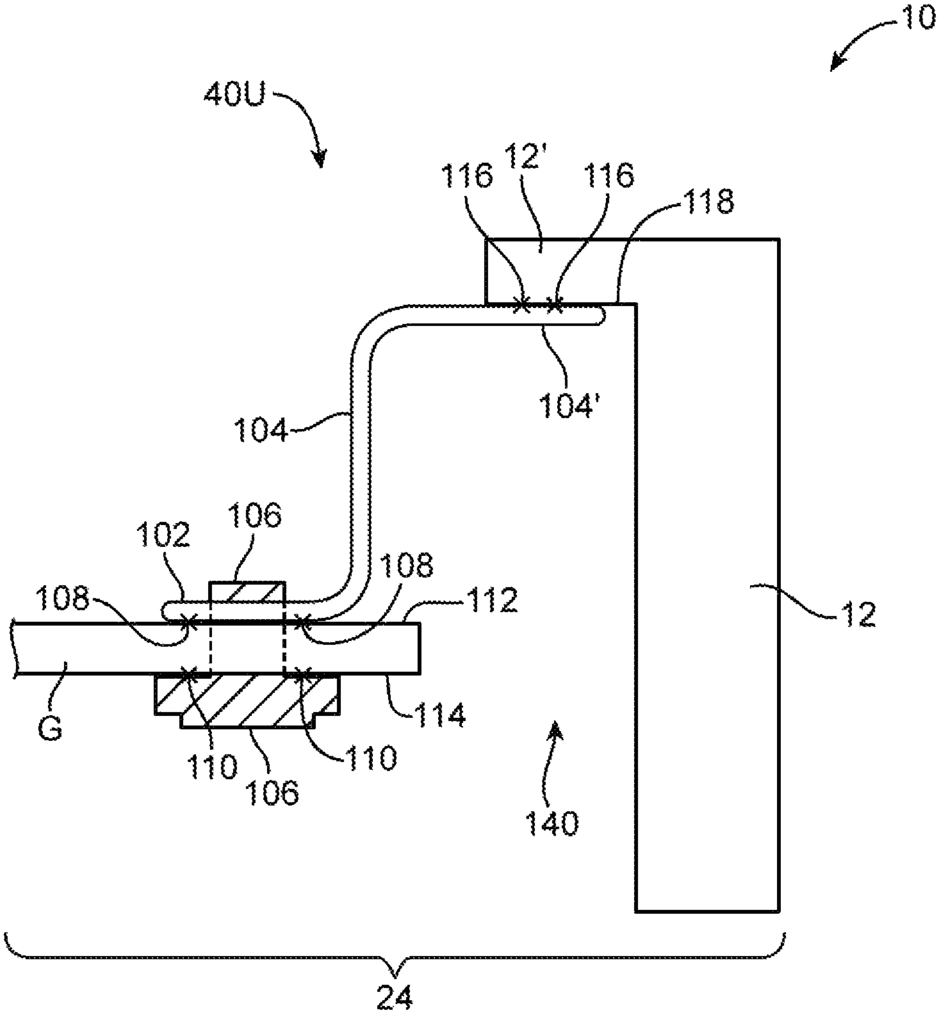
FIG. 5 is a side view of a portion of an electronic device showing how a conductive member that is connected to the upper surface of a ground plane member may bridge a dielectric gap between the ground plane member and a peripheral conductive housing member in accordance with an embodiment of the present invention.

FIG. 5 is a side view of a portion of device 10 showing how conductive member 104 may span dielectric gap 140 between ground structures G and peripheral conductive housing member 12 in antenna 40U. In the configuration of FIG. 5, member 104 has been attached to upper surface 112 of ground structures G using welds 108. Engagement structure 106 (e.g., a nut, metal post, or other suitable structure that mates with the hole or other engagement feature on conductive member 104) may be welded to lower surface 114 of ground structures G using welds 110. Welds 116 may be used to weld portion 104' of conductive member 104 to lower surface 118 of portion 12' of peripheral conductive housing member 12.

Welds 108, welds 110, welds 116, and the other welds used in device 10 may be laser welds or welds formed using other suitable welding technologies.

Figure 6:
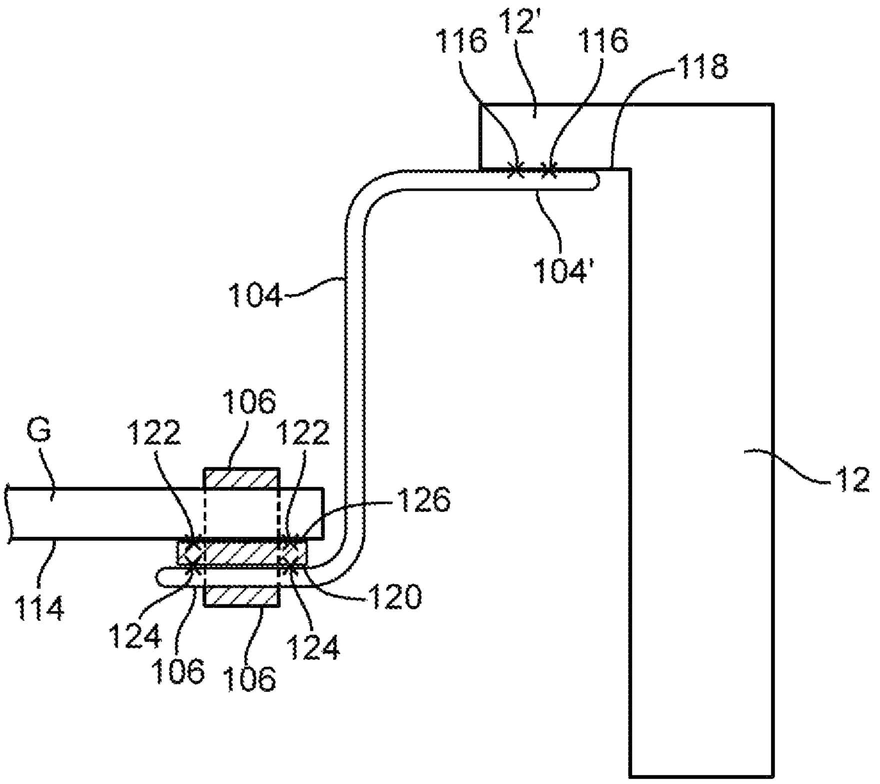
FIG. 6 is a side view of a portion of an electronic device showing how a conductive member that is connected to the lower surface of a ground plane member may bridge a dielectric gap between the ground plane member and a peripheral conductive housing member in accordance with an embodiment of the present invention.

As shown by the illustrative configuration of FIG. 6, conductive member 104 may, if desired, be attached to the lower surface of ground structures G. In the FIG. 6 arrangement, upper surface 126 of engagement structure 106 (e.g., a nut, alignment post, or other engagement member) has been mechanically and electrically attached to lower surface 114 of ground structures G using welds 122. Conductive member 104 has been welded to lower surface 120 of member 106 using welds 124.

Using an arrangement of the type shown in FIG. 5, using an arrangement of the type shown in FIG. 6, or using other suitable configurations, conductive member 104 may form a conductive path in antenna 40U such as conductive path 150 of FIG. 2.

If desired, electronic device may include conductive paths that form part of an electromagnetic shielding structure. For example, device 10 may have conductive structures such as structures 216 of FIG. 7. Conductive structures 216 may include a metal member such as bracket 204 and one or more springs such as springs 200.

Bracket 204 may have legs 206 with rounded portions that engage mating features on other structures in device 10. Bracket 204 may be attached to portions of grounding structures G (FIG. 2) or other suitable housing structures. If desired, conductive structures 216 may be formed from other types of conductive members. The example of FIG. 7 in which springs 200 are mounted to bracket 204 is merely illustrative.

Springs 200 may be attached to bracket 204 (or other suitable conductive structures) using welds such as welds 214. Engagement features such as holes 202 may be provided in springs 200 for use in positioning springs 200 properly during assembly by fabrication equipment.

Springs 200 may have one or more prongs such as prongs 208. In the illustrative configuration of FIG. 7, springs 200 have multiple prongs 208, so that each respective pair of adjacent prongs 208 is separated by a respective one of gaps (air gaps) 212.

Figure 7:
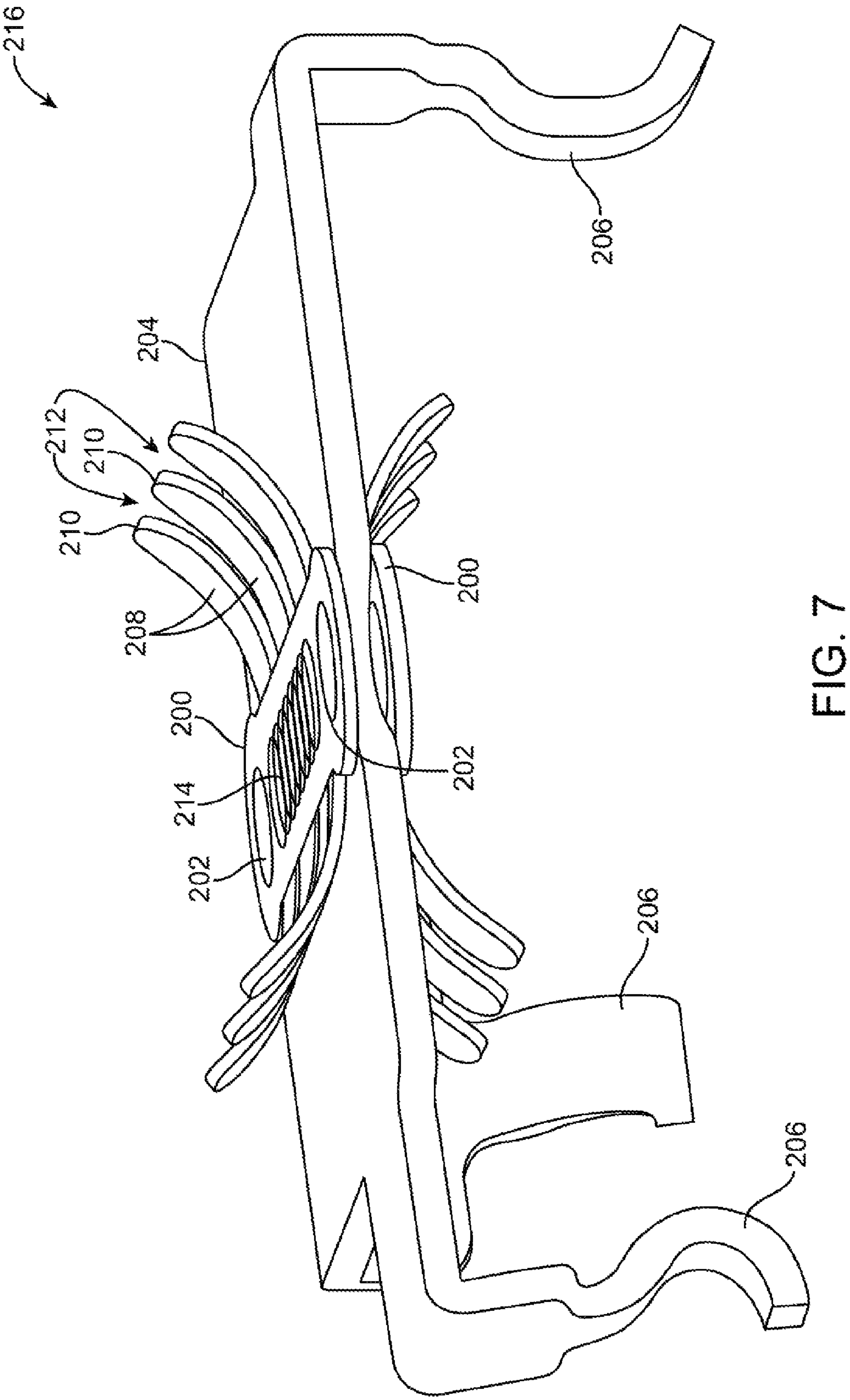
FIG. 7 is a perspective view of a bracket on which a pair of multi-prong springs has been mounted in accordance with an embodiment of the present invention.

Prong tips 210 may have a tapered shape (i.e., a shape in which the tips are narrower than the width of the main elongated body portions of prongs 208). In the example of FIG. 7, prong tips 210 are curved (rounded). Other tapered prong tip shapes that may be used in springs 200 include pointed tips with straight sides (e.g., triangular tips), trapezoidal tips, oval-shaped tips, and tip shapes with combinations of curved and straight edges.

Prongs 208 may be curved upwards to form the concave profile exhibited in FIG. 7. This may help ensure that tips 210 of spring 200 wipe along the surface of any member against which spring 200 is pressed during spring compression. The metal member that tips 210 of spring 200 press against may be, for example, a metal plate on an electrical device component, a planar metal housing structure, or other conductive planar member with which it is desired to form an electrical contact.

Figure 8:
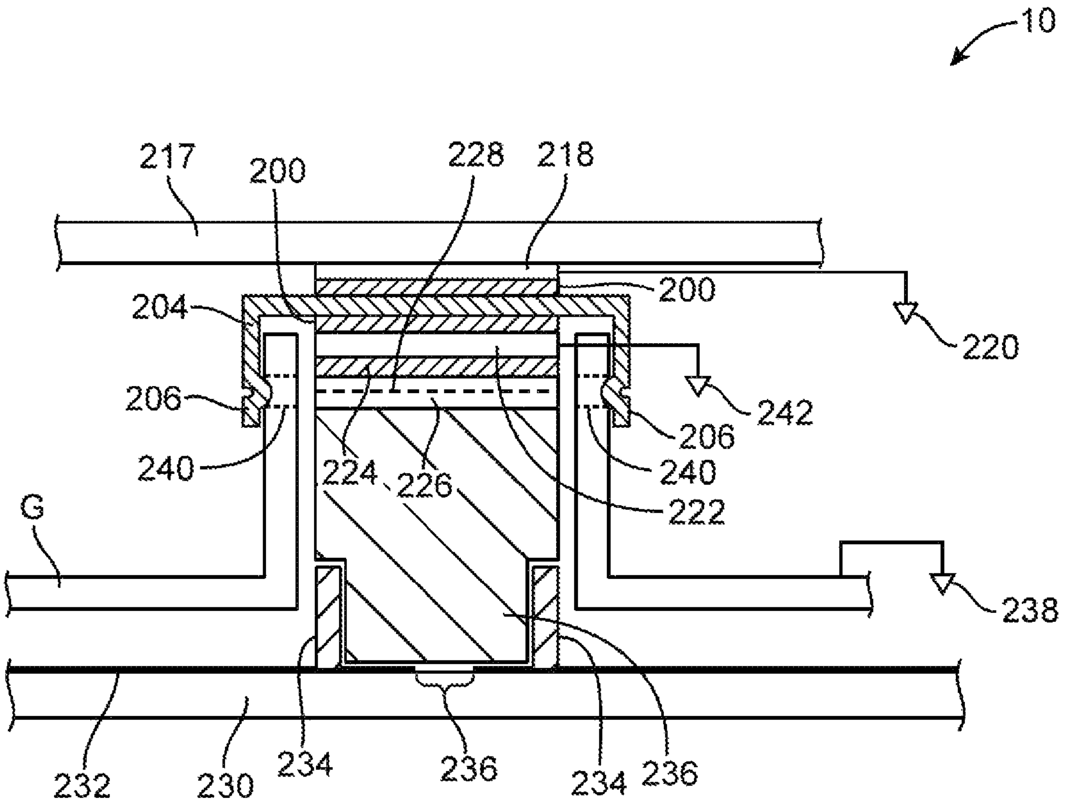
FIG. 8 is a cross-sectional side view of a portion of an electronic device that includes a component such as camera that has been mounted within a bracket that is grounded using multi-prong springs in accordance with an embodiment of the present invention.

FIG. 8 shows how the conductive structures of FIG. 7 may be used in mounting an electronic device component such as component 236 within device 10.

In the example of FIG. 8, component 236 is a camera. The lens of the camera is mounted in alignment with opening 236 in ink layer 232 on the inner surface of transparent display cover layer 230 (e.g., the cover glass for display 14). Plastic bracket 234 may be attached to cover layer 230 using adhesive (as an example).

Ground structures G may have bent portions with openings such as openings 240 that receive bent portions of bracket legs 206. This holds bracket 204 in place. A flex circuit such as flex circuit 226 may contain conductive traces such as traces 228. Traces 228 may include signal and power traces for conveying signals and power to camera 236. Traces 228 may include a ground trace that is grounded to metal flex circuit ground pad 224. A conductive member such as stainless steel stiffener 222 may optionally be interposed between the lower one of springs 200 on bracket 204 and ground member (trace) 224. The upper one of springs 200 may be interposed between bracket 204 and trace 218 on printed circuit board 217. Trace 218 on printed circuit board 217 may be formed from a gold pad or other conductive member.

Trace 218 may form printed circuit ground 220. Pad 224 and stiffener 222 may form camera ground 242. Ground structures G may form housing ground 238. When springs 200 are compressed as shown in FIG. 8, a reliable and low-resistance pathway is formed between member 218 and bracket 204 (by the upper spring) and between bracket 204 and members 222 and 224 (by the lower spring). This ensures that grounds 220, 242, and 238 are shorted together, thereby forming an electromagnetic shielding structure that helps prevent interference from camera 236 from reaching wireless circuitry in device 10.

Figure 9:
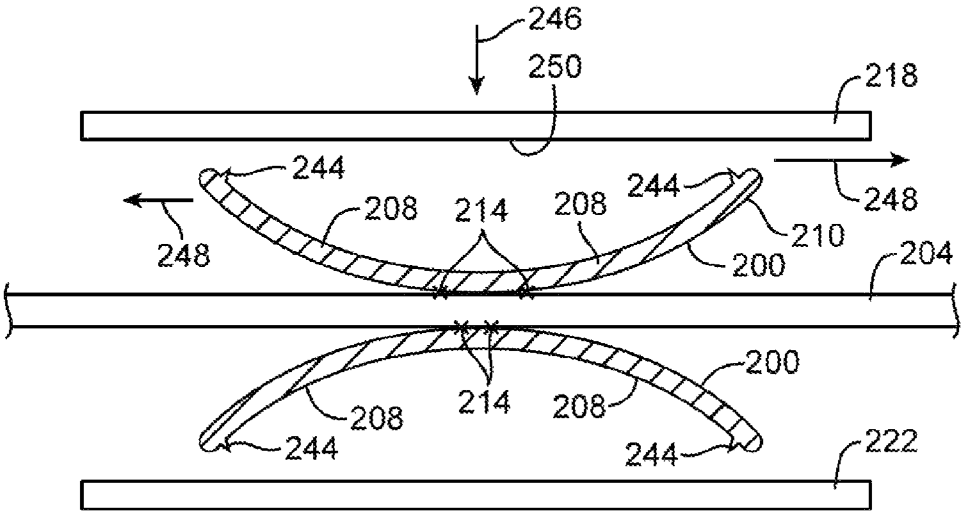
FIG. 9 is a cross-sectional side view of an illustrative conductive member such as a bracket having a pair of multi-prong springs in their uncompressed state in accordance with an embodiment of the present invention.
Figure 10:
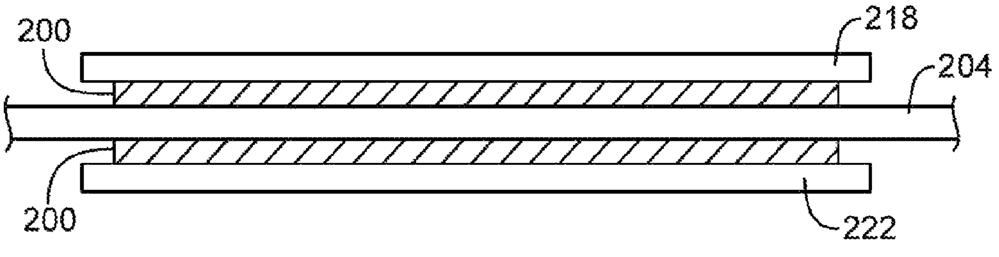
FIG. 10 is a cross-sectional side view of an illustrative conductive member such as a bracket having a pair of multi-prong springs in their compressed state in accordance with an embodiment of the present invention.

FIGS. 9 and 10 show how springs 200 may move during compression of springs 200 against adjoining conductive structures. Springs 200 are shown in their uncompressed state in FIG. 9. Following compression, springs 200 appear as shown in FIG. 10. Arrangements of the type shown in FIG. 10 are typically present following assembly of springs 200 into a finished electronic device such as device 10.

In the configuration shown in FIG. 9, springs 200 are uncompressed, so prongs 208 are curved away from bracket 204. Burrs such as burrs 244 may be formed as a result of stamping springs 200 from sheet metal. Burrs 244 are preferably oriented to face the opposing conductive members against which prongs 208 press during spring compression to aid in breaking through any insulating coatings on these conductive members.

When member 218 is pressed downwards in direction 246, springs 200 are compressed between member 222 and member 218. This causes tips 210 of springs 200 to move outwards in directions 248. When moving outwards, tips 210 of the upper one of springs 200 wipe (scrape) along lower surface 250 of member 218 and tips 210 of the lower one of springs 200 wipe along the upper surface of member 222. This wiping action and the presence of burrs 244 helps tips 210 break through any oxides or other insulating materials that may be present on the surfaces of members 218 and 222. The breaking force of tips 210 may be accentuated by the narrowed shape of tips 210 (i.e., tips that are narrower than the elongated body portions of the prongs), because the reduced surface area associated with the narrowed tips helps to increase the pressure exerted by the tips per unit area. The use of a relatively large number of narrow-tip prongs (e.g., four or more, six or more, etc.) for each spring rather than using fewer prongs with larger tips therefore helps form satisfactory ohmic contacts between springs 200 and members 218 and 222.

Another factor that enhances the performance of springs 200 relates to the curved shape of prongs 208. This shape helps to ensure that tips 210 travel along a relatively large distance on the surfaces of member 218 and 222 and therefore form a satisfactory wiping motion to break through oxides and other insulating coatings that may be present.

The lateral dimensions of springs 200 may be on the order of 1-10 mm (as an example). The thickness of springs 200 may be, for example, 0.05 to 0.2 mm. The amount of vertical travel that is experienced by the tips of springs 210 during compression may be about 0.5 to 3 mm (as an example).

In a typical configuration, the ratio of the vertical compression distance to the thickness of the spring (sometimes referred to as the spring's dynamic range) may be about 5 to 20. In contrast, conventional conductive foam pads may have a dynamic range of 0.75. The surface of the metal parts that are contacted by conventional conductive foam pads may also be subject to corrosion, leading to deterioration of the ohmic contact formed between the foam and the metal parts over time.

Springs 200 may therefore be advantageous in configurations in which thin reliable electrical contacts are desired. The use of multiple prongs with narrowed tips, curved prong shapes, and burrs may establish a satisfactory wiping action when springs 200 are compressed. The use of upper and lower springs that are identical may help stabilize springs 200 and the structures to which springs 200 are attached during spring compression and may help balance spring forces. The use of springs that have a symmetric outline (e.g., the use of a laterally symmetric spring shape having three prongs that extend outward from one side of the spring and having three prongs that extend in the opposite direction from an opposing side of the spring) may help ensure stability and prevent tilting that might reduce the effectiveness of the spring tips in wiping the surface of the adjacent metal.

Although sometimes described in connection with forming grounding structures for a component such as a camera, springs 200 may be used in any configuration within device 10 or elsewhere in which an electrical connection between multiple conductive structures is desired.

The foregoing is merely illustrative of the principles of this invention and various modifications can be made by those skilled in the art without departing from the scope and spirit of the invention.

What is claimed is:

1. Apparatus, comprising:
a first conductive member;
a second conductive member;
a spring that is welded to the first conductive member and that has a plurality of prongs that press against the second conductive member, wherein the second conductive member comprises a metal stiffener; and
a flex circuit, wherein the metal stiffener is interposed between the flex circuit and the spring.

2. The apparatus defined in claim 1 wherein the second conductive member comprises a pad on a printed circuit board.

3. The apparatus defined in claim 1 further comprising an electronic component, wherein the first conductive member comprises a metal structure, and wherein the second conductive member is electrically connected to the electronic component.

4. The apparatus defined in claim 3 wherein the electronic component comprises a camera and wherein the metal structure comprises a bracket.

5. The apparatus defined in claim 3 wherein the spring has at least four prongs.

6. The apparatus defined in claim 5 wherein the spring has a symmetrical outline.

7. The apparatus defined in claim 5 wherein the spring prongs have a curved shape when uncompressed.

8. The apparatus defined in claim 3 wherein the spring prongs have elongated body portions and wherein the prong tips are narrower than the elongated body portions.

9. The apparatus defined in claim 1 wherein the spring comprises stainless steel.

10. The apparatus defined in claim 1 wherein the spring prongs comprise burrs that face the second conductive member.

11. Apparatus, comprising:
a first conductive member;
a second conductive member;
a third conductive member;
a first spring that is welded to the second conductive member and that is compressed between the first conductive member and the second conductive member; and
a second spring that is welded to the second conductive member and that is compressed between the second conductive member and the third conductive member.

12. The apparatus defined in claim 11 wherein the first spring has multiple prongs and wherein the second spring has multiple prongs.

13. The apparatus defined in claim 11 wherein the first conductive member comprises a metal trace on a printed circuit board and wherein the third conductive member comprises a metal stiffener on a flex circuit.

14. The apparatus defined in claim 11 wherein the first and second springs each have at least four curved prongs with curved tips.

* * * * *